US008963583B2

United States Patent
Im et al.

(10) Patent No.: US 8,963,583 B2
(45) Date of Patent: Feb. 24, 2015

(54) VOLTAGE LEVEL CONVERTER AND RF SWITCHING DRIVER APPARATUS USING THE SAME

(71) Applicant: HiDeep Inc, Seongnam-si, Gyeonggi-do (KR)

(72) Inventors: Donggu Im, Daejeon (KR); Seunghyun Park, Daejeon (KR); Bonkee Kim, Seoul (KR); Youngho Cho, Gyeonggi-do (KR)

(73) Assignee: HiDeep Inc., Seongnam-si (KR)

( * ) Notice: Subject to any disclaimer, the term of this patent is extended or adjusted under 35 U.S.C. 154(b) by 0 days.

(21) Appl. No.: 14/185,296

(22) Filed: Feb. 20, 2014

(65) Prior Publication Data

US 2014/0240002 A1    Aug. 28, 2014

(30) Foreign Application Priority Data

Feb. 22, 2013   (KR) .......................... 10-2013-0019309

(51) Int. Cl.
*H03K 19/0175* (2006.01)
*H03K 19/0185* (2006.01)

(52) U.S. Cl.
CPC .................................. *H03K 19/0185* (2013.01)
USPC .................. 326/80; 326/68; 326/83; 327/333

(58) Field of Classification Search
None
See application file for complete search history.

(56) References Cited

U.S. PATENT DOCUMENTS

| 5,406,141 | A | * | 4/1995 | Yero et al. ........................ 326/68 |
| 5,969,542 | A | * | 10/1999 | Maley et al. ..................... 326/81 |
| 6,801,064 | B1 | * | 10/2004 | Hunt et al. ..................... 327/112 |
| 7,053,656 | B2 | * | 5/2006 | Seo ................. 326/68 |
| 7,132,856 | B2 | * | 11/2006 | Hsu et al. ........................ 326/81 |
| 7,295,038 | B2 | * | 11/2007 | Seo ................. 326/81 |
| 7,348,800 | B2 | * | 3/2008 | Koto et al. ..................... 326/80 |
| 7,456,654 | B1 | * | 11/2008 | Rau et al. ........................ 326/81 |
| 8,536,925 | B2 | | 9/2013 | Bhattacharya et al. |
| 2006/0044013 | A1 | * | 3/2006 | Hsu et al. ........................ 326/81 |
| 2006/0091907 | A1 | * | 5/2006 | Khan ............................. 326/81 |
| 2007/0085566 | A1 | * | 4/2007 | Koto et al. ..................... 326/80 |
| 2008/0211541 | A1 | * | 9/2008 | Chauhan ......................... 326/68 |
| 2010/0117682 | A1 | * | 5/2010 | Al-Shyoukh et al. ........... 326/80 |

FOREIGN PATENT DOCUMENTS

KR   10-2011-0119620 A   11/2011

* cited by examiner

*Primary Examiner* — Crystal L Hammond
(74) *Attorney, Agent, or Firm* — Foley & Lardner LLP

(57) ABSTRACT

Disclosed is a voltage level converter that includes: a first conversion unit which receives at least one input signal of a logic 1 signal and a logic 0 signal from a signal input terminal and converts the signal; a second conversion unit and a third conversion unit which alternately output a logic −1 signal and the logic 1 signal respectively in accordance with the input signal; a fourth conversion unit and a fifth conversion unit which alternately output the logic −1 signal and the logic 0 signal respectively in accordance with the input signal; and a latch which has a complementary characteristic in which if a first transistor becomes an on-state, then a second transistor becomes an off-state in accordance with the input signal, and performs a positive feedback operation. A drain output of the first transistor is input to the fourth conversion unit. A drain output of the second transistor is input to the fifth conversion unit.

8 Claims, 3 Drawing Sheets

VOLTAGE LEVEL CONVERTER AND RF SWITCHING DRIVER APPARATUS USING THE SAME

CROSS-REFERENCE TO RELATED APPLICATIONS

This application claims priority to Korean Patent Application No. 10-2013-0019309, filed on Feb. 22, 2013, the contents of which are hereby incorporated by reference in their entirety into the present disclosure.

BACKGROUND

1. Field

The present invention relates to a voltage level converter and an RF switching driver using the same, and more particularly to the RF switch driver including the voltage level converter which performs a voltage conversion between modules operating at different voltages.

2. Description of Related Art

In general, a voltage level conversion circuit is a converter which is provided with a fixed level voltage signal and outputs a voltage of a required level based on the voltage signal. The voltage level conversion circuit is generally used in a driver integrated circuit (IC).

Due to the requirement for a variously functional system and to the importance of mobility, the main concern of the system design is to implement a multifunctional and low power system. In view of this point, a supply voltage is becoming gradually lower. Moreover, the supply voltage has been being individually supplied to internal blocks in accordance with the functions of the various internal blocks. Therefore, there is a demand for the voltage level converter which is provided with a fixed level voltage signal and outputs an optimum voltage suitable for the requirement of each block.

SUMMARY

The present invention provides a voltage level converter which receives a logic 1 signal and a logic 0 signal as an input and outputs three state signals of the logic 1 signal, the logic 0 signal and a logic −1 signal in accordance with a control signal. Here, the logic 1 signal may be a +VDD signal, the logic 0 signal may be a GND signal, and the logic −1 signal may be a −VDD signal.

One aspect of the voltage level converter of the present invention is to include a first conversion unit which receives at least one input signal of a logic 1 signal and a logic 0 signal from a signal input terminal and converts the signal; a second conversion unit and a third conversion unit which alternately output a logic −1 signal and the logic 1 signal respectively in accordance with the input signal; a fourth conversion unit and a fifth conversion unit which alternately output the logic −1 signal and the logic 0 signal respectively in accordance with the input signal; and a latch which performs a positive feedback operation in order to implement the stable operations of the conversion units.

The first conversion unit may output the logic 0 signal when the input signal is the logic 1 signal and may output the logic 1 signal when the input signal is logic 0 signal. The second conversion unit and the third conversion unit may output the logic 1 signal and the logic −1 signal respectively when the input signal is logic 1 signal and may output the logic −1 signal and the logic 1 signal respectively when the input signal is the logic 0 signal. The fourth conversion unit and the fifth conversion unit may output the logic −1 signal and the logic 0 signal respectively when the input signal is logic 1 signal and may output the logic 0 signal and the logic −1 signal respectively when the input signal is the logic 0 signal.

The first to fifth conversion units may be comprised respectively of an inverter including a P-type transistor and an N-type transistor which are connected in series. The logic 1 signal and the logic 0 signal may be applied respectively to a source of the P-type transistor and a source of the N-type transistor of the first conversion unit. A source of the P-type transistor and a source of the N-type transistor of the second conversion unit may be connected respectively to the signal input terminal and a first latch output terminal of the latch, and the logic 0 signal may be applied to an input terminal. A source of the P-type transistor and a source of the N-type transistor of the third conversion unit may be connected respectively to an output terminal of the first inverter and a second latch output terminal of the latch, and the logic 0 signal may be applied to the input terminal. The logic 0 signal and the logic −1 signal may be applied respectively to a source of the P-type transistor and a source of the N-type transistor of the fourth conversion unit, and the input terminal may be connected to the first latch output terminal of the latch. The logic 0 signal and the logic −1 signal may be applied respectively to a source of the P-type transistor and a source of the N-type transistor of the fifth conversion unit, and the input terminal may be connected to the second latch output terminal of the latch.

The first conversion unit may include a first inverter, the second conversion unit may include a second inverter, the third conversion unit may include a third inverter, the fourth conversion unit may include a fourth inverter, and the fifth conversion unit may include a fifth inverter, and at least one of the first to fifth inverters may be a CMOS inverter.

The latch may include a first transistor and a second transistor which are the N-type transistor. The drain of the first transistor and a gate of the second transistor may be connected to the first latch output terminal of the latch. A gate of the first transistor and the drain of the second transistor may be connected to the second latch output terminal of the latch. The logic −1 signal may be applied to sources of the first and second transistors.

The voltage level converter may further include a capacitor which is inserted between a ground and at least one of the output terminals of the second to fifth conversion units.

An RF switch driver of the present invention includes the voltage level converter according to the embodiment of the present invention.

DETAILED DESCRIPTION

Figure 1:
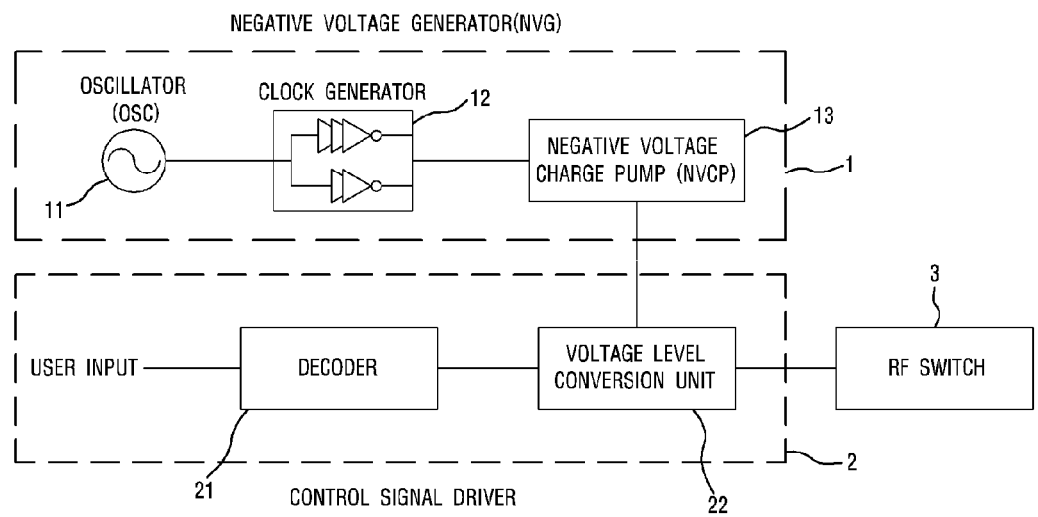
FIG. 1 is a block diagram showing an RF switch driver according to an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereafter, exemplary embodiments of the present invention will be described in detail with reference to the accompanying drawings in order that the present invention may be easily implemented by those skilled in the art.

Prior to the description of a voltage level converter, it is assumed that a positive voltage which is applied when a transistor is in an on-state with respect to a voltage signal applied to the transistor is designated as VDD. Here, a logic 1 signal has a voltage of from about VDD/2 to VDD, and a logic 0 signal has a voltage of from a ground signal of 0V to about VDD/2. A criteria for classifying the voltage signal which is applied to the transistor into the logic 1 signal and the logic 0 signal is not necessarily fixed and may be changed depending on implementation environments of a negative voltage supplier and the voltage level converter according to the embodiment of the present invention, for example, the size of the positive voltage VDD to be applied or characteristics of the transistor, and the like. In other words, it should be understood in this specification that the "logic 1" and "logic 0" are not signals having a particular value and have a relative concept. If the voltage signal is relatively high, it corresponds to the "logic 1", and if the voltage signal is relatively low, it corresponds to the "logic 0".

An Embodiment of the Present Invention

FIG. 1 is a block diagram showing an RF switch driver according to an embodiment of the present invention.

As shown in FIG. 1, the RF switch driver according to the embodiment of the present invention includes a negative voltage generator (NVG) 1, a control signal driver 2 and an RF switch 3.

The NVG 1 may include an oscillator (OSC) 11, a clock generator 12 which generates a clock signal and an inverted clock signal by using the output signal of the oscillator 11, and a negative voltage charge pump (NVCP) 13 which uses the clock signal and the inverted clock signal. The structure of NVG 1 shown in FIG. 1 is not limited to this. The NVG 1 may have any structure capable of providing the negative voltage to the control signal driver 2.

The control signal driver 2 may include a decoder 21 and a voltage lever conversion unit 22. The decoder 21 receives and decodes a user input. The voltage lever conversion unit 22 outputs a voltage for driving the RF switch 3 by using the input signal from the decoder 21 and a negative voltage signal which is input from the negative voltage supplier.

The RF switch 3 receives the voltage signal from the control signal driver 2 and performs impedance matching through capacitor tuning, and the like, for the purpose of improving the sensitivity of an RF antenna, etc., and removing noise.

The NVG 1 and the control signal driver 2 are components for controlling the RF switch and are generally implemented by an IC chip and used in electronic devices. Therefore, it is advantageous to reduce the number or size of the components. Also, the RF switch is implemented by a transistor in order to ensure a rapid response speed. The gate or body of the transistor requires a logic −1 signal (negative voltage signal) so as to enhance the power drive capability of the transistor.

The RF switch driver according to the embodiment of the present invention can output all the logic −1 signal, logic 0 signal, and logic 1 signal for driving the RF switch. Also, it is possible to reduce the chip area of the RF switch driver by making a conventional voltage level converter smaller.

Hereafter, the voltage level converter of the RF switch driver according to the embodiment of the present invention will be described.

Figure 2:
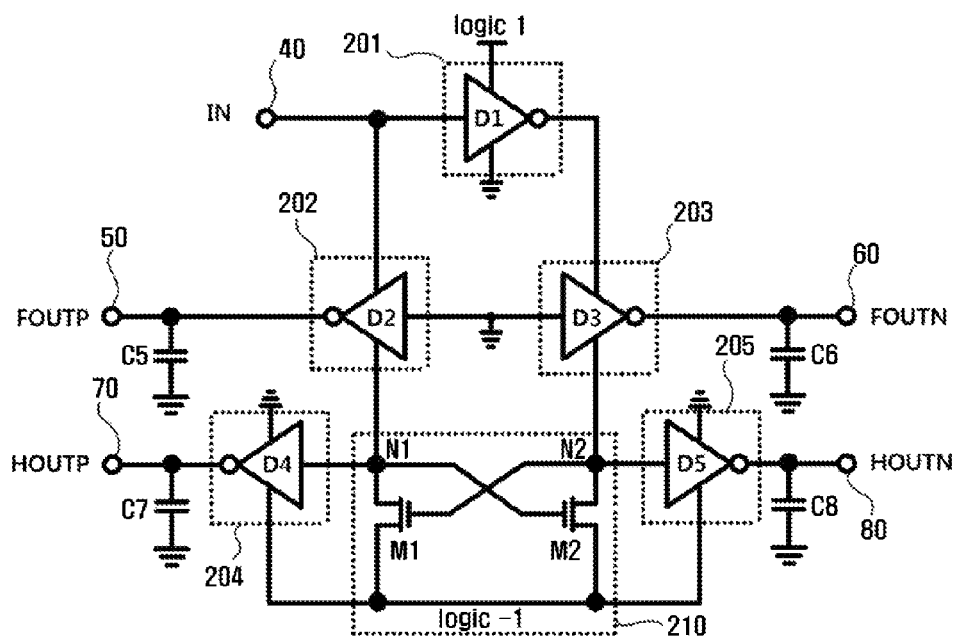
FIG. 2 is a circuit diagram showing a voltage level converter according to the embodiment of the present invention.

FIG. 2 shows the voltage level converter according to the embodiment of the present invention.

Referring to FIG. 2, the voltage level converter according to the embodiment of the present invention includes a first conversion unit 201, a second conversion unit 202, a third conversion unit 203, a fourth conversion unit 204, a fifth conversion unit 205, and a latch 210.

As shown in FIG. 2, the voltage level converter according to the embodiment of the present invention includes the first conversion unit 201 which receives the positive voltage signal VDD of the logic 1 signal or 0V signal of the logic 0 signal from an input terminal 40 and converts and outputs the signal, the second conversion unit 202 and the third conversion unit 203 which receive and convert the logic 0 signal and alternately output the logic 1 signal and the logic −1 signal to a first output terminal FOUTP 50 and a second output terminal FOUTN 60 respectively, the latch 210 which, when the input signal is the logic 0 signal, converts the drain voltage signal of M1 into the logic −1 signal by allowing the M1 to be electrically connected, and converts the drain voltage signal of M2 into the near the logic 0 signal by switching off the M2 (if the input signal is the logic 1 signal, the M1 and M2 of the latch operate complementarily), and the fourth conversion unit 204 and the fifth conversion unit 205 which output alternately the logic −1 signal and logic 0 signal in accordance with the signal input from the latch 210. Here, the logic −1 signal may be a negative voltage signal having the same magnitude as that of the positive voltage signal VDD corresponding to the logic 1 which is applied to a clock voltage signal CLK.

Figure 4:
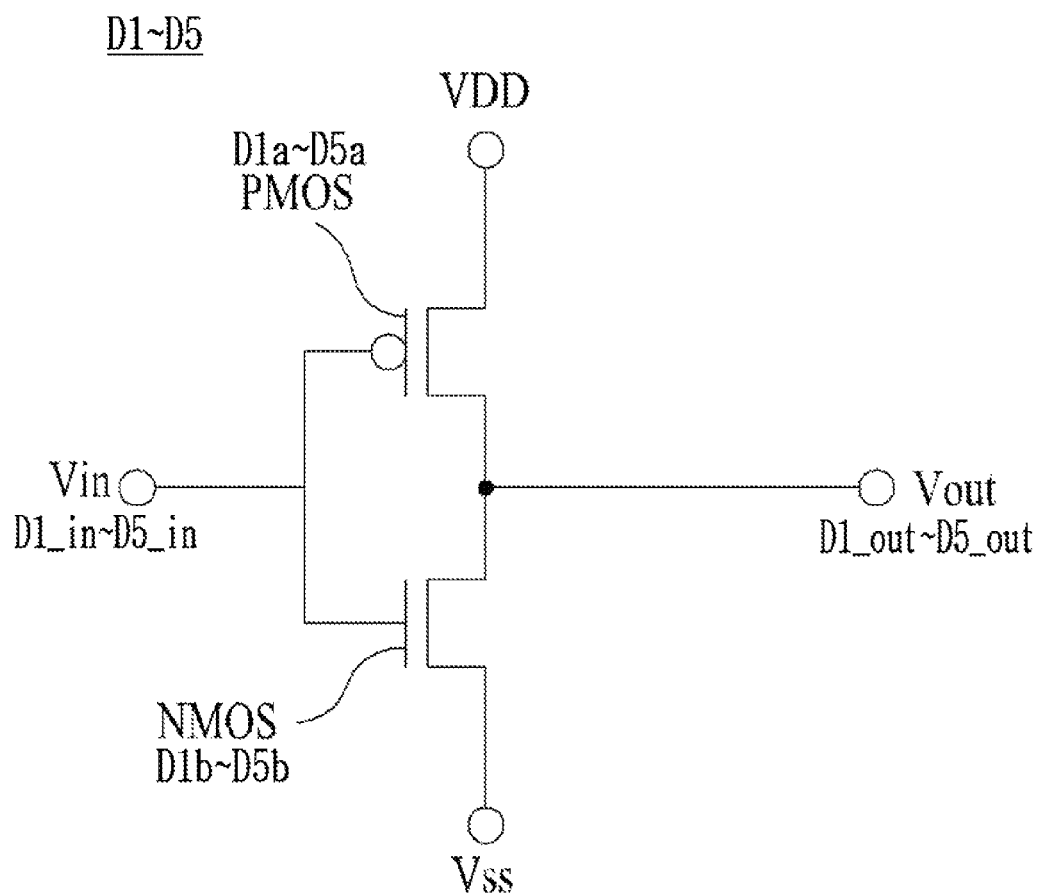
FIG. 4 is a circuit diagram of an inverter according to the embodiment of the present invention.

The first conversion unit 201 may include a first inverter D1. The second conversion unit 202 may include a second inverter D2. The third conversion unit 203 may include a third inverter D3. The fourth conversion unit 204 may include a fourth inverter D4. The fifth conversion unit 205 may include a fifth inverter D5. The first to fifth inverters D1 to D5 may be comprised respectively of a CMOS inverter formed by connecting in series P-type transistors D1a, D2a, D3a, D4a, and D5a and N-type transistors D1b, D2b, D3b, D4b, and D5b. The CMOS inverter is shown in FIG. 4 and can be implemented by the prior art. Therefore, detailed description thereof will be omitted.

The latch 210 may be comprised of the N-type transistors M1 and M2. A first latch output terminal N1 outputting a first latch signal may be connected to the second inverter D2 and the fourth inverter D4. A second latch output terminal N2 outputting a second latch signal may be connected to the third inverter D3 and the fifth inverter D5.

As shown in FIG. 2, the voltage level converter according to the embodiment of the present invention may receive the logic 1 signal or the logic 0 signal from the input terminal 40 and output four voltages to the first output terminal FOUTP 50, the second output terminal FOUTN 60, a third output terminal HOUTP 70, and a fourth output terminal HOUTN 80. Bypass capacitors C5, C6, C7, and C8 may be connected to the output terminals 50, 60, 70, and 80 respectively.

Hereafter, connection relationships among respective components will be described with reference to FIGS. 2 and 4.

As shown in FIGS. 2 and 4, in the first inverter D1, the positive voltage signal VDD of the logic 1 signal is applied to the source of the P-type transistor D1a, the source of the N-type transistor D1b is grounded so that the logic 0 signal may be applied to the source of the N-type transistor D1b. The input terminal D1_in of the first inverter D1 is connected to the source of the P-type transistor D2a of the second inverter D2, and the output terminal D1_out of the first inverter D1 is connected to the source of the P-type transistor D3a of the third inverter D3.

The source of the P-type transistor D2a of the second inverter D2 is connected to the input terminal D1_in of the first inverter D1. The source of the N-type transistor D2b is connected to the first latch output terminal N1. The first latch output terminal N1 is connected to the gate of the second transistor M2, and the signal of the first latch output terminal N1 is able to control the on/off of the second transistor M2. An input terminal D2_in of the second inverter D2 is connected to the ground terminal of the logic 0 signal, and converts the input logic 0 signal and outputs the signal to the first output terminal FOUTP 50.

The source of the P-type transistor D3a of the third inverter D3 is connected to the output terminal D1_out of the first inverter D1. The source of the N-type transistor D3b is connected to the second latch output terminal N2. The second latch output terminal N2 is connected to the gate of the first transistor M1, and the signal of the second latch output terminal N2 is able to control the on/off of the first transistor M1. An input terminal D3_in of the third inverter D3 is connected to the ground terminal of the logic 0 signal, and converts the input logic 0 signal and outputs the signal to the third output terminal FOUTN 60.

The logic 0 signal is applied to the source of the P-type transistor D4a of the fourth inverter D4, and the logic −1 signal is applied to the source of the N-type transistor D4b. An input terminal D4_in is connected to the first latch output terminal N1. The fourth inverter D4 may convert the first input latch output terminal signal and output the signal to the third output terminal HOUTP 70.

The logic 0 signal is applied to the source of the P-type transistor D5a of the fifth inverter D5, and the logic −1 signal is applied to the source of the N-type transistor D5b. An input terminal D5_in is connected to the second latch output terminal N2. The fifth inverter D5 may convert the second input latch output terminal signal and output the signal to the fourth output terminal HOUTN 80.

The bypass capacitors C5, C6, C7, and C8 may be connected to the first to fourth output terminals 50, 60, 70, and 80 respectively.

The drain of the first transistor M1 of the latch 210 may be connected to the gate of the second transistor M2, the drain of the second transistor M2 may be connected to the gate of the first transistor M1. The sources of the first and second transistors M1 and M2 are connected to each other, and the logic −1 signal is applied to the sources of the two transistors M1 and M2.

Next, the operation of the voltage level converter according to the embodiment of the present invention will be described.

Figure 3A:
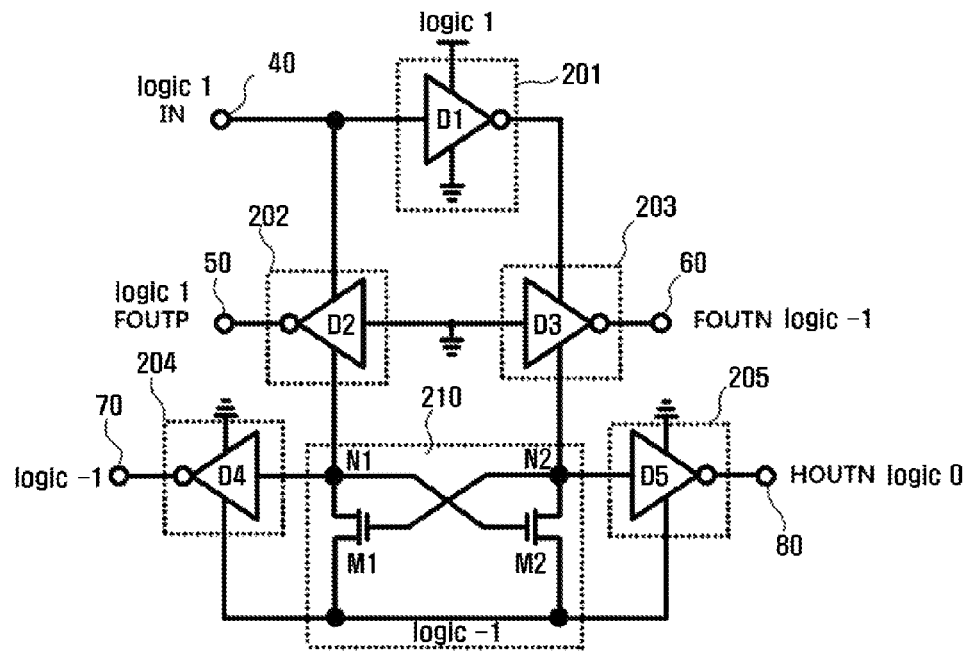
FIGS. 3a and 3b are circuit diagrams showing operations of the voltage level converter according to input signals.

FIG. 3a shows an operation when the positive voltage signal VDD of a high signal H is input to the voltage input terminal 40 of the voltage level converter according to the embodiment of the present invention.

As shown in FIGS. 3a and 4, the positive voltage signal VDD of the logic 1 signal is input to the input terminal 40. The first inverter D1 receives the logic 1 signal and converts into the logic 0 signal, and then transmits the converted signal to the source of the P-type transistor of the third inverter D3.

In the second inverter D2, the source of the P-type transistor receives an input voltage of the logic 1 signal. The source of NMOS receives the logic 0 signal of the first latch signal. Since the input terminal of the second inverter D2 receives the logic 0 signal, the logic 1 signal is output to the output terminal FOUTP 50.

In the third terminal D3, the source of the P-type transistor receives the output signal of the first inverter D1, i.e., the logic 0 signal. The source of the NMOS receives the logic −1 signal of the second latch signal. Since the input terminal of the third inverter D3 receives the logic 0 signal, the logic −1 signal is output to the output terminal FOUTN 60.

In the fourth inverter D4, the logic 0 signal is applied to the source of the P-type transistor. The logic −1 signal is input to the source of the N-type transistor. Since the input terminal of the fourth inverter D4 receives the logic 0 signal of the first latch signal, the logic −1 signal is output to the third output terminal HOUTP 70.

In the fifth inverter D5, the logic 0 signal is applied to the source of the P-type transistor. The logic −1 signal is input to the source of the N-type transistor. Since the input terminal of the fifth inverter D5 receives the logic −1 signal of the second latch signal, the logic 0 signal is output to the fourth output terminal HOUTN 80.

That is, in summary, when the input signal is the logic 1 signal, the signals of the output terminal FOUTP 50, the output terminal FOUTN 60, the output terminal HOUTP 70 and the output terminal HOUTN 80 are the logic 1 signal, the logic −1 signal, the logic −1 signal and the logic 0 signal, respectively. When the input signal is the logic 0 signal, the voltage level converter operates complementarily in the same manner, and the signals of the output terminal FOUTP 50, the output terminal FOUTN 60, the output terminal HOUTP 70 and the output terminal HOUTN 80 are the logic −1 signal, the logic 1 signal, the logic 0 signal and the logic −1 signal, respectively.

Figure 3B:
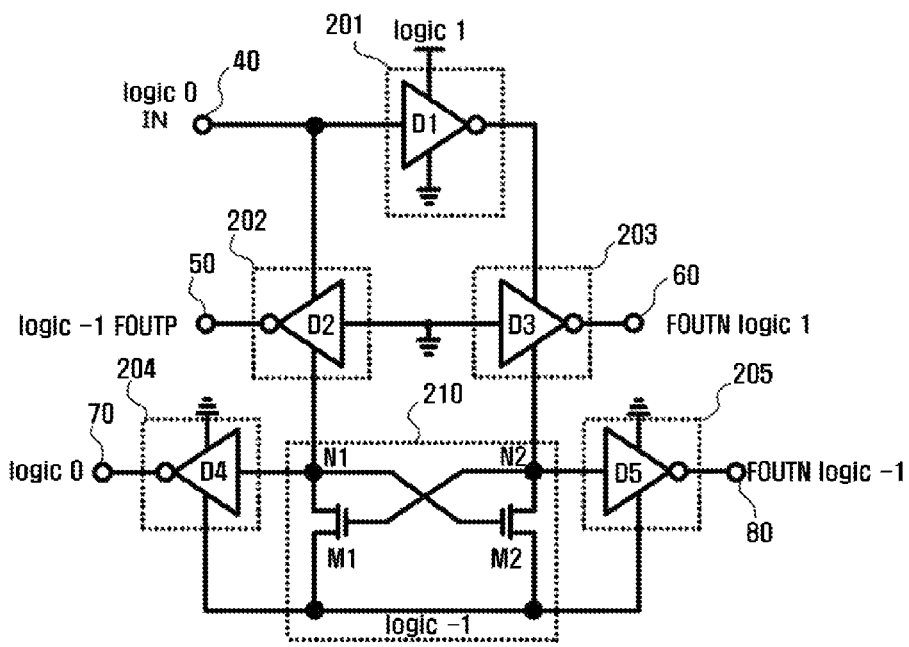

FIG. 3b shows that the logic 0 signal instead of the positive voltage signal VDD of the logic 1 signal is input to the input terminal 40.

Since the operation of FIG. 3b is complementary for that of FIG. 3a, detailed descriptions thereof will be omitted.

In conclusion, when the input signal is changed from the logic 1 signal to the logic 0 signal, the signal of the output terminal FOUTP 50 is changed from the logic 1 signal to the logic −1 signal, the second output terminal FOUTN 60 is changed from the logic −1 signal to the logic 1 signal, the third output terminal HOUTP 70 is changed from the logic −1 signal to the logic 0 signal, and the fourth output terminal HOUTN 80 is changed from the logic 0 signal to the logic −1 signal. This is suitable for the control signals of the gate terminal and body terminal, which is used to maximize the power drive capability of the RF switch.

In summary of the foregoing, the voltage level converter according to the embodiment of the present invention is able to output all of the voltages from the negative voltage −VDD to the positive voltage VDD by using the negative voltage and the input voltage. That is, the voltage level converter receives the input signal swinging between the ground voltage GND and the power voltage VDD and is able to output the signal as a full-swing output signal swinging between the ground voltage level and the negative voltage −VDD. The output signal is output from the first output terminal FOUTP 50 and the second output terminal FOUTN 60. Also, the voltage level converter is able to output the signal as a half-swing output signal swinging between the negative voltage −VDD and the ground signal. The output signal is output from the third output terminal HOUTP 70 and the fourth output terminal HOUTN 80. Therefore, all outputs can be provided to an electronic device requiring the negative voltage, a low signal L and a high signal H, for example, the RF switch driver using the negative voltage. Also, thanks to the latch structure, the voltage level converter consumes little static current. Moreover, the voltage level converter can be so smaller as to be easily implemented by one IC chip.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A voltage level converter comprising:
 a first conversion unit which receives at least one input signal of a logic 1 signal and a logic 0 signal from a signal input terminal and converts the signal;
 a second conversion unit and a third conversion unit which alternately output a logic −1 signal and the logic 1 signal respectively in accordance with the input signal;
 a fourth conversion unit and a fifth conversion unit which alternately output the logic −1 signal and the logic 0 signal respectively in accordance with the input signal; and
 a latch which has a complementary characteristic in which if a first transistor becomes an on-state, then a second transistor becomes an off-state in accordance with the input signal, and performs a positive feedback operation, wherein a drain output of the first transistor is input to the fourth conversion unit, and wherein a drain output of the second transistor is input to the fifth conversion unit.

2. The voltage level converter of claim 1,
 wherein the first conversion unit outputs the logic 0 signal when the input signal is the logic 1 signal and outputs the logic 1 signal when the input signal is logic 0 signal,
 wherein the second conversion unit and the third conversion unit output the logic 1 signal and the logic −1 signal respectively when the input signal is logic 1 signal and output the logic −1 signal and the logic 1 signal respectively when the input signal is the logic 0 signal,
 and wherein the fourth conversion unit and the fifth conversion unit output the logic −1 signal and the logic 0 signal respectively when the input signal is logic 1 signal and output the logic 0 signal and the logic −1 signal respectively when the input signal is the logic 0 signal.

3. The voltage level converter of claim 1,
 wherein the first to fifth conversion units are comprised respectively of an inverter including a P-type transistor and an N-type transistor which are connected in series,
 wherein the logic 1 signal and the logic 0 signal are applied respectively to a source of the P-type transistor and a source of the N-type transistor of the first conversion unit,
 wherein a source of the P-type transistor and a source of the N-type transistor of the second conversion unit are connected respectively to the signal input terminal and a first latch output terminal of the latch, and the logic 0 signal is applied to an input terminal of the second conversion unit,
 wherein a source of the P-type transistor and a source of the N-type transistor of the third conversion unit are connected respectively to an output terminal of the first inverter and a second latch output terminal of the latch, and the logic 0 signal is applied to an input terminal of the third conversion unit,
 wherein the logic 0 signal and the logic −1 signal are applied respectively to a source of the P-type transistor and a source of the N-type transistor of the fourth conversion unit, and an input terminal of the fourth conversion unit is connected to the first latch output terminal of the latch, and
 wherein the logic 0 signal and the logic −1 signal are applied respectively to a source of the P-type transistor and a source of the N-type transistor of the fifth conversion unit, and an input terminal of the fifth conversion unit is connected to the second latch output terminal of the latch.

4. The voltage level converter of claim 3,
 wherein the first conversion unit comprises a first inverter, the second conversion unit comprises a second inverter, the third conversion unit comprises a third inverter, the fourth conversion unit comprises a fourth inverter, and the fifth conversion unit comprises a fifth inverter, and
 wherein at least one of the first to fifth inverters is a CMOS inverter.

5. The voltage level converter of claim 3,
 wherein the latch comprises a first transistor and a second transistor which are the N-type transistor,
 wherein the drain of the first transistor and a gate of the second transistor are connected to the first latch output terminal of the latch,
 wherein a gate of the first transistor and the drain of the second transistor are connected to the second latch output terminal of the latch, and
 wherein the logic −1 signal is applied to sources of the first and second transistors.

6. An RF switch driver comprising the voltage level converter of claim 5.

7. The voltage level converter of claim 1, further comprising a capacitor which is inserted between a ground and at least one of the output terminals of the second to fifth conversion units.

8. An RF switch driver comprising the voltage level converter of claim 1.

* * * * *